(12) United States Patent
Matsumoto et al.

(10) Patent No.: US 7,531,844 B2
(45) Date of Patent: May 12, 2009

(54) LIGHT EMITTING ELEMENT

(75) Inventors: Akihisa Matsumoto, Tottori (JP);
Tatsuya Motoike, Tottori (JP);
Toshinori Nakahara, Tottori (JP)

(73) Assignees: Sanyo Electric Co., Ltd., Osaka (JP);
Tottori Sanyo Electric Co., Ltd., Tottori (JP)

( * ) Notice: Subject to any disclaimer, the term of this patent is extended or adjusted under 35 U.S.C. 154(b) by 413 days.

(21) Appl. No.: 10/529,725

(22) PCT Filed: Sep. 29, 2003

(86) PCT No.: PCT/JP03/12439

§ 371 (c)(1),
(2), (4) Date: Nov. 8, 2005

(87) PCT Pub. No.: WO2004/034529

PCT Pub. Date: Apr. 22, 2004

(65) Prior Publication Data

US 2006/0108669 A1      May 25, 2006

(30) Foreign Application Priority Data

Sep. 30, 2002   (JP)   ............................. 2002-285594

(51) Int. Cl.
*H01L 29/22*    (2006.01)
*H01L 29/227*   (2006.01)

(52) U.S. Cl. ............................. 257/98; 257/99; 257/433; 257/666; 257/784; 257/E25.032

(58) Field of Classification Search .................. 257/98, 257/99, 433, 784, 666, E25.032
See application file for complete search history.

(56) References Cited

U.S. PATENT DOCUMENTS

| 5,639,990 A | * | 6/1997 | Nishihara et al. | ........... 174/527 |
| 5,907,151 A | * | 5/1999 | Gramann et al. | ......... 250/214.1 |
| 6,220,764 B1 | * | 4/2001 | Kato et al. | ..................... 385/92 |
| 6,521,989 B2 | * | 2/2003 | Zhou | ........................... 257/698 |
| 6,867,367 B2 | * | 3/2005 | Zimmerman | ................ 174/528 |

FOREIGN PATENT DOCUMENTS

| JP | 54-084996 | 7/1979 |
| JP | 01-270282 | 10/1989 |
| JP | 3-188692 A | 8/1991 |
| JP | 04-280487 | 10/1992 |
| JP | 05-129711 | 5/1993 |
| JP | 05-218507 | 8/1993 |
| JP | 2001-291812 | 10/2001 |
| JP | 2001-308437 | 11/2001 |
| JP | 2002-176203 | 6/2002 |
| JP | 2002-252373 | 9/2002 |
| JP | 2003-152228 A | 5/2003 |
| JP | 2003-197974 | 7/2003 |

* cited by examiner

*Primary Examiner*—Nitin Parekh
(74) *Attorney, Agent, or Firm*—McDermott Will & Emery LLP

(57) ABSTRACT

A light emitting element includes: a box-shaped case formed by an insulation material and having a space inside; a lead frame formed by a conductive material and fixed to the case; and a light emitting chip fixed to the lead frame. On the lead frame, a rise portion is formed in a side wall of the case or along the inner surface of the side wall. The lead frame has a first lead frame fixing the light emitting chip and a second lead frame connected to the light emitting chip by the wire bonding. At least on the first lead frame, a rise portion is formed.

4 Claims, 7 Drawing Sheets

LIGHT EMITTING ELEMENT

TECHNICAL FIELD

The present invention relates to a light emitting element that is built by combining together a light emitting chip and a lead frame.

BACKGROUND ART

There is one type of light emitting element called a frame laser. The frame laser is built by fixing a pair of lead frames formed out of a conductive material in a case formed out of an insulating material, with a semiconductor laser element fixed on one of the lead frames and connected by wire bonding to the other lead frame. Japanese Patent Application Laid-open No. H3-188692 discloses an example of a frame laser. Japanese Patent Application Laid-open No. 2003-152228 discloses an example of a light emitting element having a light emitting diode fixed on a lead frame.

Semiconductor lasers are widely used in writing data onto optical recording media or reading data therefrom. Due to a recent trend toward large capacity optical discs, the volume of data to be read and written has significantly increased, leading to demand for semiconductor lasers capable of exerting higher power.

The increase in the power exerted by a semiconductor laser results in an increase in the volume of heat generated. The increase in the temperature of a light emitting element causes problems such as deformation or discoloration of the case that encloses the semiconductor laser, requiring more effective measures against heat.

One common measure against heat is to increase the area of the lead frame so as to improve heat dissipation. Simply increasing the area of the lead frame, however, may result in the enlarged portion protruding out of the case. The portion protruding out of the case requires insulation, leading to an increase in the number of processes, which in turn leads to higher cost. Enclosing the entire lead frame including the enlarged portion inside the case so as to omit the need for insulation leads to overall upsizing, which goes against the downsizing trend of components.

DISCLOSURE OF THE INVENTION

In view of the above-mentioned problems, it is an object of the present invention to enclose a light emitting chip with a lead frame with a view to preventing deformation and discoloration of a case and with a view to improving heat dissipation achieved by the lead frame in order to permit the light emitting chip to exert higher power.

To achieve the above object, a light emitting element of the present invention is structured as follows. According to a first aspect of the present invention, a light emitting element includes: a box-shaped case formed out of an insulating material and having a hollow portion inside; a lead frame formed out of a conductive material and fixed in the case; and a light emitting chip fixed on the lead frame, wherein the lead frame has a rise portion formed so as to be located inside a side wall of the case. This structure permits the heat emitted by the light emitting chip fixed on the lead frame to dissipate through the rise portion, thereby checking an increase in the temperature of the case. This in turn avoids the deformation and discoloration of the case, thereby permitting the light emitting chip to exert higher power without concern over such phenomena.

According to a second aspect of the invention, in the light emitting element structured as described above, the rise portion is formed by bending both side edges of the lead frame. This structure permits the rise portion to be formed only by adding a bending process to the forming processes of the lead frame, making it easy to fabricate.

According to a third aspect of the invention, in the light emitting element structured as described above, the lead frame includes a first lead frame on which the light emitting chip is fixed and a second lead frame connected to the light emitting chip by wire bonding, and the rise portion is formed at least on the first lead frame. This structure, in which the rise portion is formed at least on the first lead frame on which the light emitting chip is fixed, forces heat to dissipate through the first lead frame heated to a high temperature, thereby effectively checking an increase in the temperature of the case.

According to a fourth aspect of the invention, a light emitting element includes: a box-shaped case formed out of an insulating material and having a hollow portion inside; a lead frame formed out of a conductive material and fixed in the case; and a light emitting chip fixed on the lead frame, wherein the lead frame has a rise portion formed along the inner surface of a side wall of the case. This structure permits the rise portion to directly face the light emitting chip, thereby permitting the heat emitted by the light emitting chip to dissipate more quickly.

According to a fifth aspect of the invention, in the light emitting element structured as described above, the hollow portion is surrounded by four side walls of the case, and the rise portion is formed along at least three of the side walls. This structure prevents, by means of the rise portion formed along at least the three side walls, radiation of the heat emitted by the light emitting chip toward the three side walls, thus avoiding heat diffusion.

According to a sixth aspect of the invention, in the light emitting element structured as described above, the rise portion is formed by bending both side edges of the lead frame and the end edge thereof orthogonal to the side edges. This structure permits the formation of the rise portion simply by adding a bending process to the forming processes of the lead frame, making it easy to fabricate.

According to a seventh aspect of the invention, in the light emitting element structured as described above, the lead frame includes a first lead frame on which the light emitting chip is fixed and a second lead frame connected to the light emitting chip by wire bonding, and the rise portion is formed at least on the first lead frame. This structure, in which the rise portion is formed at least on the first lead frame along the three side walls of the case, forces heat to dissipate from the first lead frame heated to a high temperature through the rise portion formed along the three side walls, thereby effectively checking an increase in the temperature of the case.

According to the eighth aspect of the invention, in the light emitting element structured as described above, the second lead frame has a rise portion formed so as to cover a side wall of the case other than the side walls covered by the rise portion of the first lead frame. This structure permits the numbers of rise portions allocated to the first and second lead frames, respectively, to be set according to factors such as dimensional restrictions on the lead frame and outer dimensions of the case, thereby optimizing heat dissipation.

According to a ninth aspect of the invention, a light emitting element includes: a box-shaped case formed out of an insulating material and having a hollow portion inside; a first lead frame and a second lead frame formed out of a conductive material and fixed in the case so as to face the hollow portion; and a light emitting chip fixed on the first lead frame, wherein the first lead frame has a rise portion formed so as to stretch over two opposite side walls of four side walls of the case surrounding the hollow portion, wherein the second lead frame overlaps the first lead frame with a vertical gap left therebetween, and wherein the second lead frame is connected to the light emitting chip by wire bonding. This structure can ensure a required area for heat dissipation even if the number of rise portions needs to be reduced for some reason, thanks to the first lead frame having a long rise portion.

According to a tenth embodiment of the invention, in the light emitting element structured as described above, the second lead frame is arranged above the first lead frame. This structure permits easy wire bonding of the light emitting chip.

According to an eleventh embodiment of the invention, a light emitting element includes: a case formed out of an insulating material and having a hollow portion formed inside so as to have a cross section so tapered as to widen upward; a first lead and a second lead each having one end arranged on the bottom surface of the hollow portion and the other end protruding out of the case; a light emitting chip fixed on the first lead and connected to the second lead by wire bonding in the hollow portion; and a reflecting frame formed out of a metal and fixed on the inner circumferential surface of the hollow portion with a small distance left from the first and second leads so as not to short-circuit the first and second leads. This structure permits the heat emitted by the light emitting element to efficiently dissipate through the leads and the reflecting frame.

According to a twelfth aspect of the invention, in the light emitting element structured as described above, a plurality of light emitting chips are arranged in the hollow portion, and the first and second leads are arranged in the same numbers as the light emitting chips. This structure permits various chip arrangements.

According to a thirteenth aspect of the invention, in the light emitting element structured as described above, a concave portion for receiving a lead is formed on the outer bottom surface of the case, and portions of the first and second leads that protrude out of the case are bent into the concave portion. This structure permits the leads to remain flat at the time of molding the case, and thus suffers less from resin leakage and permits easier fabrication than when bent leads are insert-molded into the case.

BEST MODE FOR CARRYING OUT THE INVENTION

Hereinafter, embodiments of the present invention will be described with reference to the accompanying drawings.

Figure 1:
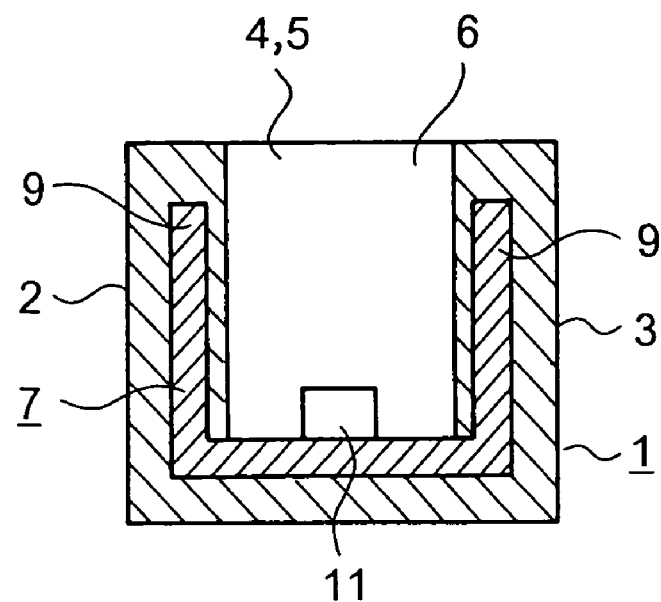
FIG. 1 is a cross section of a light emitting element according to a first embodiment of the present invention.
Figure 2:
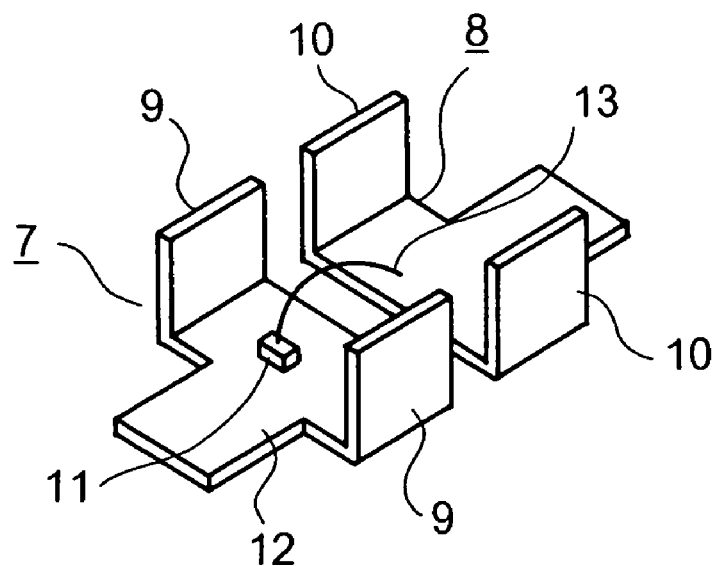
FIG. 2 is a perspective view of lead frames of the light emitting element according to the first embodiment.

FIGS. 1 and 2 show a first embodiment of the present invention. FIG. 1 is a cross section of a light emitting element. FIG. 2 is a perspective view of lead frames used in the light emitting element of FIG. 1.

The light emitting element includes a box-shaped case 1 formed out of an insulating material, such as epoxy resin. The case 1 has a hollow portion 6 formed inside it surrounded by the four side walls 2, 3, 4, and 5 thereof so as to be open at the top. To the case 1 are fixed a first lead frame 7 and a second lead frame 8. The first and second lead frames 7 and 8 are formed out of a conductive material such as copper, iron, or aluminum, and are integrally molded with the case 1.

As observed in FIG. 2, the first and second lead frames 7 and 8 are mutually symmetrical in shape. Each of the lead frames has two edges bent upward, thereby forming rise portions 9 on the first lead frame 7 and rise portions 10 on the second lead frame 8. When the case 1 is molded, the rise portions 9 and 10 are so mounted as to be located inside the side walls 2 and 3, whereby the first and second lead frames 7 and 8 are fixed in the case 1.

The first lead frame 7 has a light emitting chip 11 fixed on a bottom portion 12 thereof. The light emitting chip 11 is connected to the second lead frame 8 by wire bonding 13.

The heat generated by the light emitting chip 11 is conducted to the first lead frame 7, which is thus heated to a higher temperature and dissipates the heat through the rise portions 9 into the space outside the case 1. That is, the heat that has been conducted to the first lead frame 7 is forced to dissipate into the outside space. The second lead frame 8 receives heat from the hollow portion 6 and dissipates the heat through the rise portions 10 into space outside the case 1. Thus achieved heat dissipation checks an increase in the temperature of the case 1, thereby preventing the deformation and discoloration of the case 1. This therefore permits the light emitting chip 11 to be made capable of exerting higher power without concern over deformation and discoloration of the case 1.

The rise portions 9 and 10 can easily be molded by simply adding a bending process to forming processes of the first and second lead frames 7 and 8.

Figure 3:
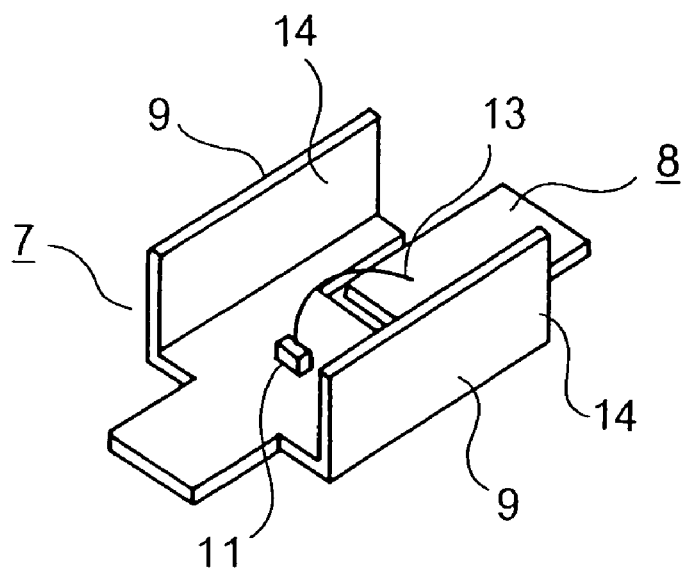
FIG. 3 is a perspective view showing a modified example of the lead frames of the light emitting element according to the first embodiment.

In the structure of FIG. 2, both the first and second lead frames 7 and 8 have rise portions. Alternatively, only one of the lead frames may have rise portions, in which case the rise portions are extended to have a greater total length with an extension portion added thereto. FIG. 3 shows, as a modified example, an example of such lead frames.

In the structure of FIG. 3, the second lead frame 8 does not have rise portions. Instead, the rise portions 9 of the first lead frame 7 form extension portions 14, 14 that extend in such a way as to include the rise portions 10 of the second lead frame 8 shown in FIG. 2. Specifically, the rise portions 9 have substantially the same lengths as the side walls 2 and 3, and stretch over two opposite side walls 4 and 5. Heat dissipates through the rise portions 9, each of which has come up to have a large area, leading to higher heat dissipation efficiency enough to compensate the amount of heat that would dissipate through the now eliminated rise portions of the second lead frame 8.

Figure 4:
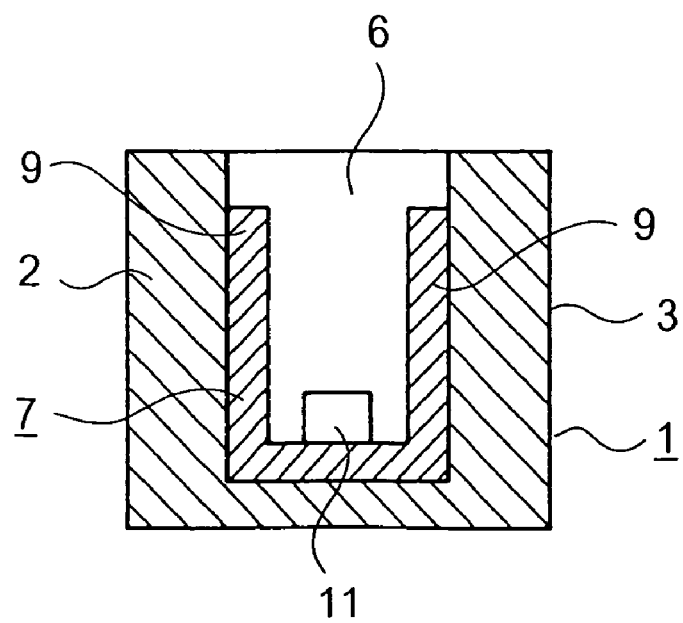
FIG. 4 is a cross section of a light emitting element according to a second embodiment of the present invention.

FIG. 4 shows a second embodiment of the present invention. FIG. 4 is a cross section of a light emitting element.

In the second embodiment, the light emitting element includes a first lead frame 7 and a second lead frame 8 built with the same structure as those shown in FIGS. 2 and 3. The first and second lead frames 7 and 8, however, have rise portions 9 and 10, respectively, which are arranged not inside but along and in close contact with the inner surfaces of the side walls 2 and 3. Thus, the rise portions 9 and 10 directly face a light emitting chip 11, thereby permitting the heat emitted by the light emitting chip 11 to be quickly dissipated.

Figure 5:
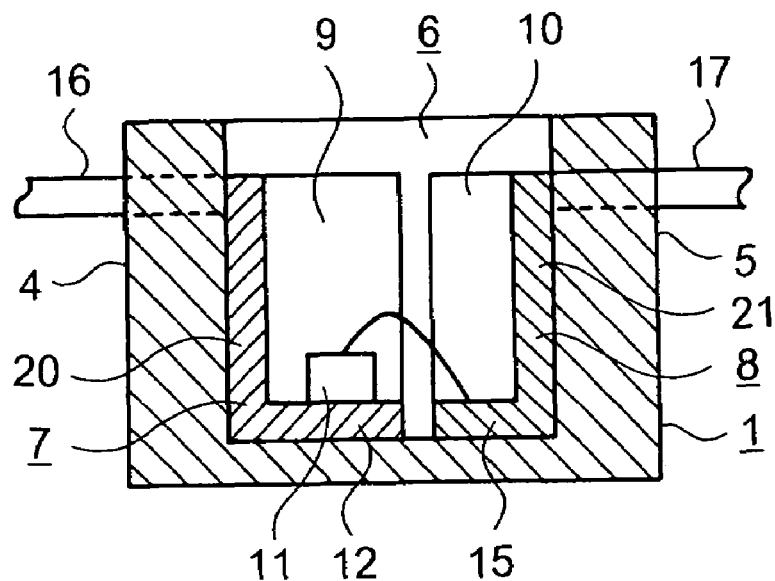
FIG. 5 is a cross section of a light emitting element according to a third embodiment of the present invention.
Figure 6:
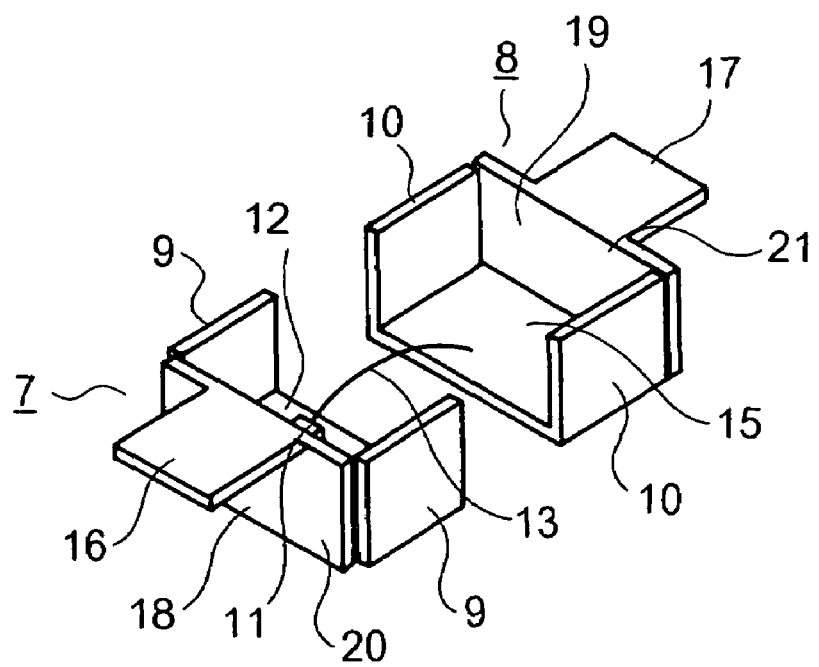
FIG. 6 is a perspective view of lead frames of the light emitting element according to the third embodiment.

FIGS. 5 and 6 show a third embodiment of the present invention. FIG. 5 is a cross section of a light emitting element. FIG. 6 is a perspective view of lead frames used in the light emitting element of FIG. 5.

In the third embodiment, a first lead frame 7 and a second lead frame 8 are mutually symmetrical in shape and structured in the following manner. Specifically, the first lead frame 7 includes: a bottom portion 12; rise portions 9 formed by bending upward the both side edges of the bottom portion 12; a rise portion 20 formed by bending upward an end edge 18 orthogonal to the side edges; and a lead portion 16 protruding from the rise portion 20. The second lead frame 8 includes: a bottom portion 15; rise portions 10 formed by bending upward the both side edges of the bottom portion 15; a rise portion 21 formed by bending upward an end edge 19 orthogonal to the side edges; and a lead portion 17 protruding from the rise portion 21.

The rise portions 9 and 20 of the first lead frame 7 are arranged along and in close contact with the inner surfaces of side walls 2, 3, and 4. The rise portions 10 and 21 of the second lead frame 8 are arranged along and in close contact with the inner surfaces of the side walls 2, 3, and 5. Accordingly, the side walls 2, 3, 4, and 5 have the inner surfaces thereof all covered by the rise portions.

The lead portions 16 and 17, as shown in FIG. 5, are located at relatively the upper portions of the side walls 4 and 5, respectively, and are so laid as to run out of a case 1 through the side walls 4 and 5.

The rise portions 9, 10, 20, and 21, which are formed along the inner surfaces of the four side walls 2, 3, 4, and 5 of the case 1, prevents the heat emitted by a light emitting chip 11 from radiating in four directions, thereby avoiding heat diffusion.

The rise portions may be formed along three of the four side walls of the case 1, instead of along all these side walls as described above. As a result, the three rise portions prevent the heat emitted by the light emitting chip 11 from radiating in the three directions, thereby avoiding heat diffusion.

The first lead frame 7 on which the light emitting chip 11 is fixed has the rise portions 9, and 20 formed along the three side walls 2, 3, and 4; therefore, heat is forced by at least these three side walls to dissipate through the first lead frame 7 that is heated to a higher temperature, thereby effectively avoiding an increase in the temperature of the case 1.

The rise portion portions 9, 10, 20, and 21 are easily manufactured simply by adding a bending process to forming processes of the first and second lead frames 7 and 8.

Figure 7:
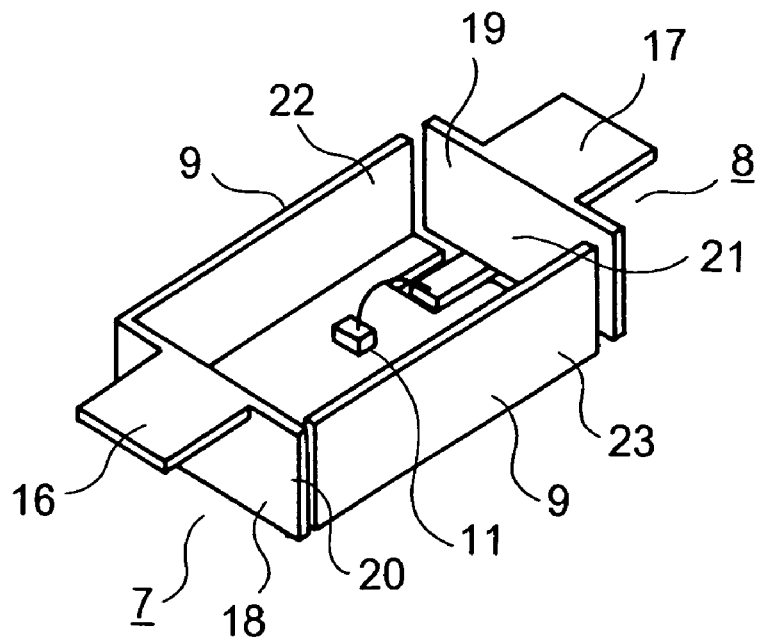
FIG. 7 is a perspective view showing a modified example of the lead frames of the light emitting element according to the third embodiment.

In the structure of FIG. 6, both the first and second lead frames 7 and 8 respectively have the both side edges thereof bent upward so as to form the rise portions. Alternatively, only one of the lead frames may have rise portions formed on the both side edges thereof, in which case the rise portions are extended to have a greater total length with an extension portion added thereto. FIG. 7 shows, as a modified example, an example of such lead frames.

In the structure of FIG. 7, the second lead frame 8 does not have rise portions formed on the both side edges thereof, only left with a rise portion 21 formed on the end edge thereof. Instead, the rise portions 9 of the first lead frame 7 form extension portions 22 and 23 that extend in such a way as to include the side portions 10 of the second lead frame 8 in FIG. 6. Specifically, the rise portions 9 have substantially the same lengths as the side walls 2 and 3, and stretch over two opposite side walls 4 and 5. As a result, the side walls 2, 3, 4, and 5 have the inner surfaces thereof all covered by the rise portions 9, 20, and 21.

The rise portion 21 of the second lead frame 8 covers the side wall (side wall 5) other than those (the side walls 2, 3, and 4) covered by the rise portions 9 and 20 of the first lead frame 7. Sharing of roles in covering the side walls 2, 3, 4, and 5 between the first lead frame 7 and the second lead frame 8 as described above permits setting suitable numbers of rise portions allocated to the first and second lead frames 7 and 8, respectively, according to factors such as the dimensional restrictions on a lead frame and the outer dimensions of the case 1, thereby optimizing heat dissipation.

Figure 8:
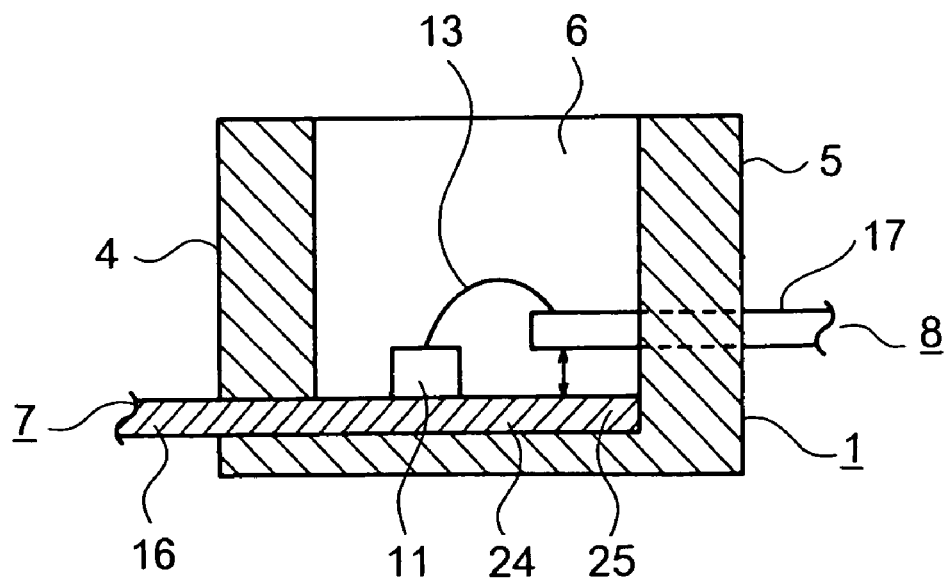
FIG. 8 is a cross section of a light emitting element according to a fourth embodiment of the present invention.

FIG. 8 shows a fourth embodiment of the present invention. FIG. 8 is a cross section of a light emitting element.

In the fourth embodiment, a first lead frame 7 has an extension portion 24 formed on the bottom portion thereof. The extension portion 24 passes through a hollow portion 6 surrounded by side walls 2, 3, 4, and 5 and reaches the inner surface of the opposite side wall 5. A second lead frame 8 is fixed with the side wall 5 in such a manner as to lie above the first lead frame 7. A lead portion 17 of the second lead frame 8 penetrates through the side wall 5. There is provided a gap W between the first lead frame 7 and the second lead frame 8.

As with the first lead frame 7 of FIG. 7, the first lead frame 7 of FIG. 8 has on the both side edges thereof rise portions 9 (not shown) that have substantially the same lengths as the side walls 2 and 3 and stretch over the two opposite side walls 4 and 5.

The structure according to the fourth embodiment permits the area of the first lead frame 7 to be increased without enlargement of the case 1. Even if the number of rise portions needs to be reduced for some reason, the extension portion provided to the first lead frame 7 permits increasing a region through which heat dissipates, thereby ensuring the amount of heat dissipation. The arrangement of the second lead frame 8 above the first lead frame 7 permits easy wire bonding of a light emitting chip 11.

In any of the first to fourth embodiments, the light emitting chip 11 is fixed on the bottom portion of the first lead frame 7, and is surrounded by the first lead frame 7 only or in collaboration with the second lead frame 8.

Figure 9:
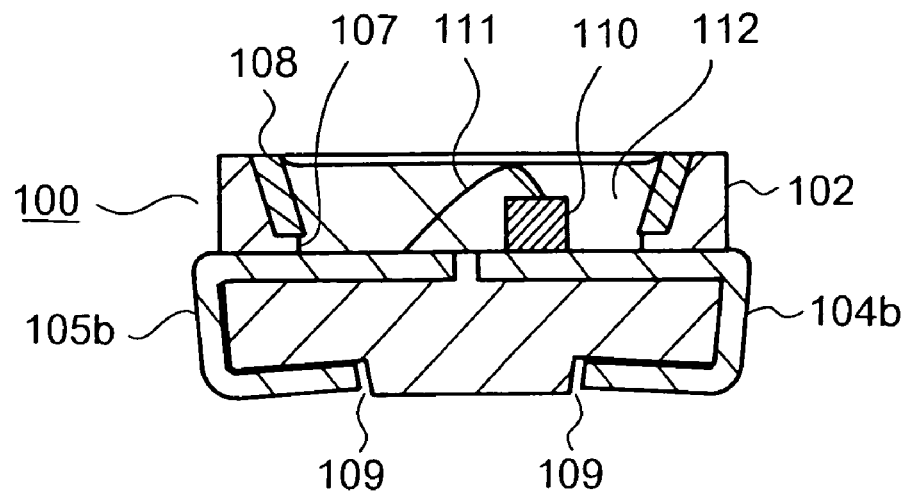
FIG. 9 is a cross section of a light emitting element according to a fifth embodiment of the present invention.
Figure 10:
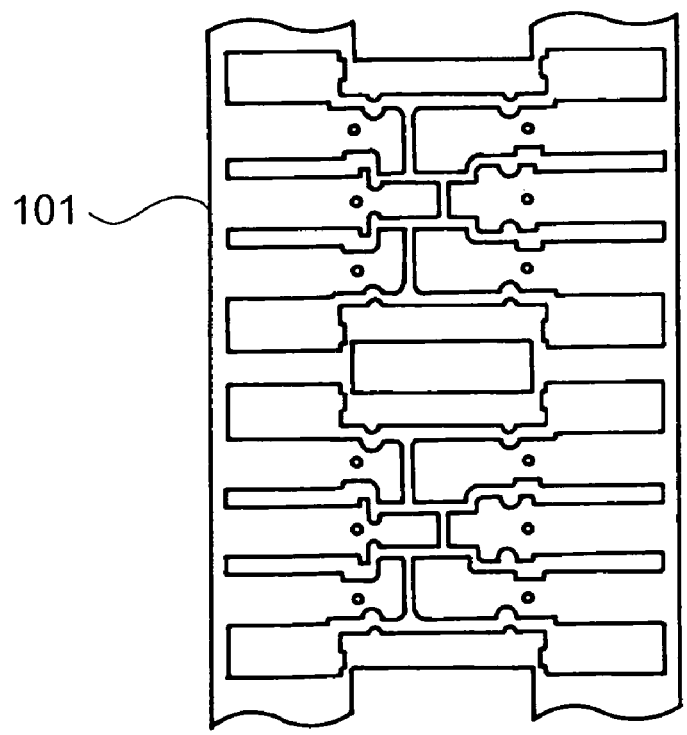
FIG. 10 is a plan view of a lead frame used in the light emitting element according to the fifth embodiment.
Figure 11:
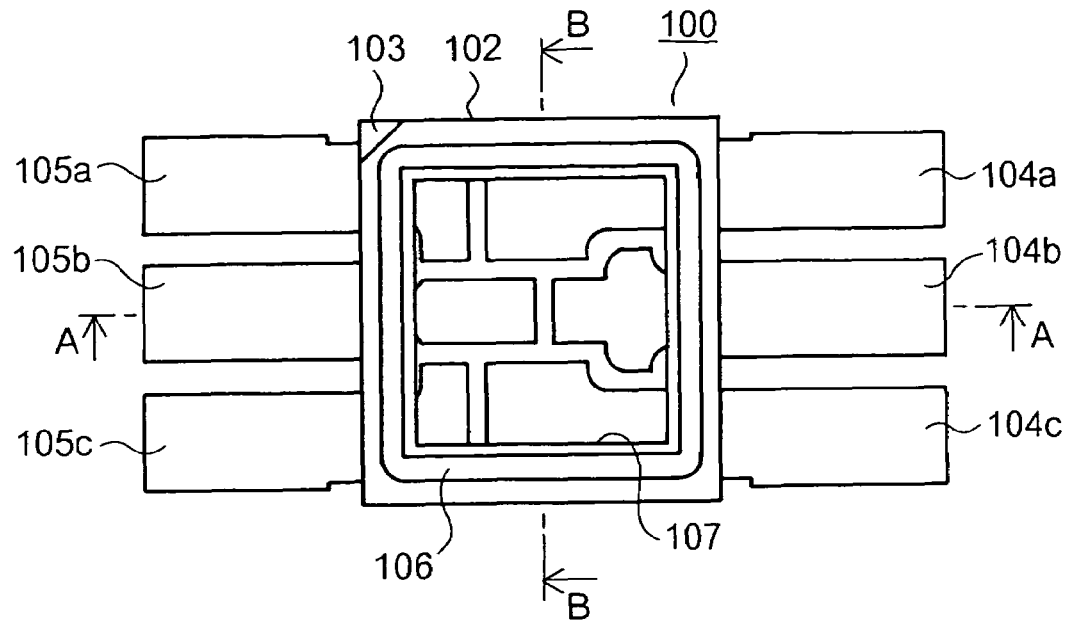
FIG. 11 is a plan view showing one step of the fabrication process of the light emitting element according to the fifth embodiment.
Figure 12:
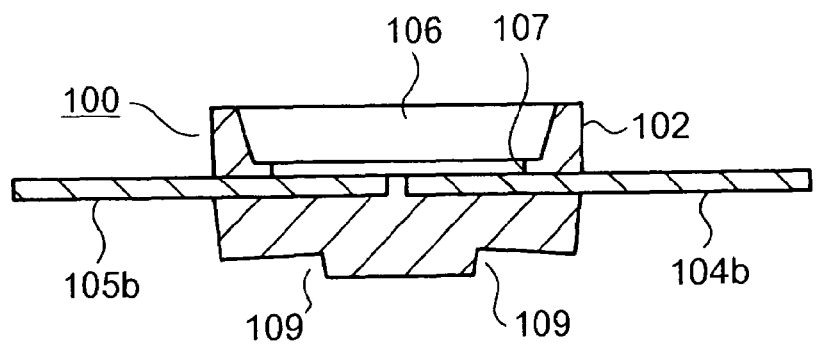
FIG. 12 is a cross section of the light emitting element according to the fifth embodiment, taken on line A-A shown in FIG. 11.
Figure 13:
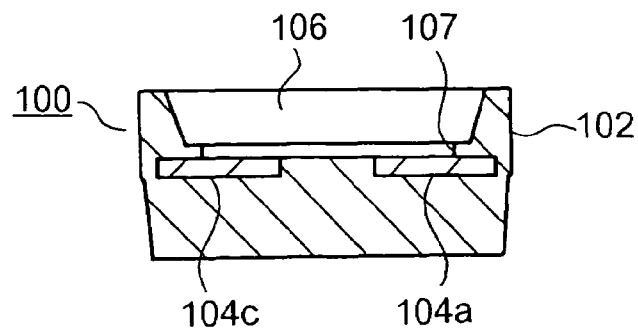
FIG. 13 is a cross section of the light emitting element according to the fifth embodiment, taken on line B-B shown in FIG. 11.
Figure 14:
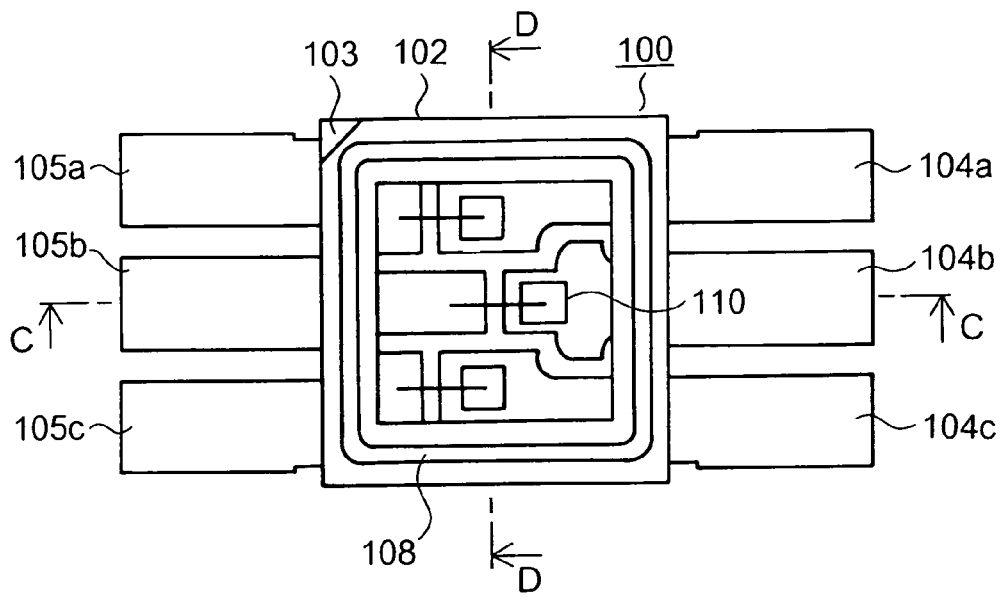
FIG. 14 is a plan view showing another step, later than the one shown in FIG. 11, of the fabrication process of the light emitting element according to the fifth embodiment.
Figure 15:
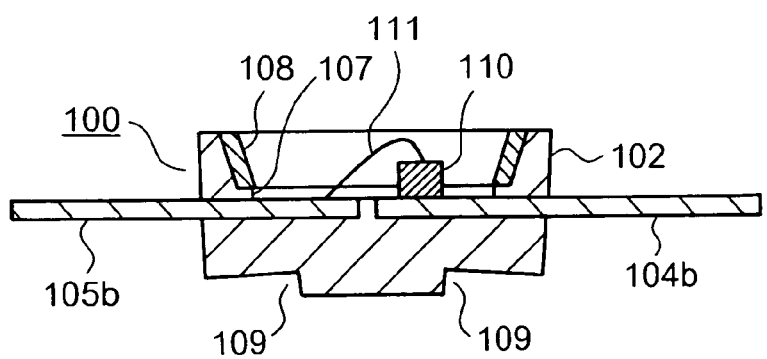
FIG. 15 is a cross section of the light emitting element according to the fifth embodiment, taken on line C-C shown in FIG. 14.
Figure 16:
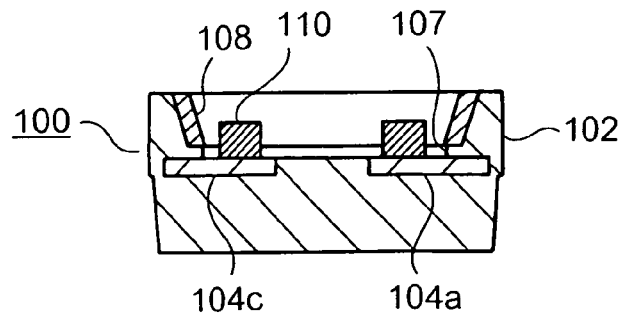
FIG. 16 is a cross section of the light emitting element according to the fifth embodiment, taken on line D-D shown in FIG. 14.

FIGS. 9 to 16 show a fifth embodiment of the present invention. FIG. 9 is a cross section of a light emitting element. FIG. 10 is a plan view of a lead frame. FIG. 11 is a plan view showing one step of the fabrication process of the light emitting element. FIG. 12 is a cross section, taken on line A-A shown in FIG. 1. Similarly, FIG. 13 is a cross section, taken on line B-B shown in FIG. 11. FIG. 14 is a plan view showing another step, later than the one shown in FIG. 11, of the fabrication processes of the light emitting element. FIG. 15 is a cross section, taken on line C-C shown in FIG. 14. Similarly, FIG. 16 is a cross section, taken on line D-D shown in FIG. 14.

The light emitting element of the fifth embodiment has a package 100 having a case formed out of synthetic resin and combined with leads formed out of a metal. In manufacturing the package 100, a lead frame 101 as shown in FIG. 10 is first prepared. The lead frame 101 is formed by punching band-like sheet metal so as to form a lead pattern that recurs with a fixed pitch. The case 102 formed out of synthetic resin is injection-molded, in this case, insert-molded, at a predetermined position, with the lead frame 101 not bent but kept flat. After the package 100 shown in FIGS. 11 to 13 is formed in the above-mentioned manner, the package 100 is surface-bonded or wire-bonded. At the final stage, the leads are separated, completing the light-emitting element. The leads can be separated by pressing or other methods.

Synthetic resin having a high brightness level, e.g., white synthetic resin, is used as the material for the case 102. At one corner of the case 102, there is formed a concave portion 103 with a triangular plan shape as shown in FIG. 11. The concave portion 103 is used for polarity identification.

The number of leads finally remaining in the case 102 after the separation is performed at the final stage is six in total. Three of these leads are first leads 104a, 104b, and 104c, and the remaining three leads are second leads 105a, 105b, and 105c. The first leads 104a, 104b, and 104c line with the second leads 105a, 105b, and 105c, respectively. A gap is provided between the leads for insulation.

The case 102 has a hollow portion 106 having a rectangular plan shape and a cross section so tapered as to widen upward, and thus having an overall shape of an inverted square pyramid. The first leads 104a, 104b, and 104c, and the second leads 105a, 105b, and 105c are each fixed in the case 102, with one end thereof placed on the bottom surface of the hollow portion 106 and the other end thereof protruded out of the case 102.

An inner flange 107 is formed under the hollow portion 106 where the oblique surfaces forming the side surfaces intersect the bottom surface. The inner flange 107 lies over the first leads 104a, 104b, and 104c, and the second leads 105a, 105b, and 105c, and has a smaller thickness than the leads.

A reflecting frame 108 formed out of a metal is fixed on the inner circumferential surface of the hollow portion 106 in order to efficiently cast the light emitted by the light emitting chip. As is the case with the hollow portion 106, the reflecting frame 108 has a cross section so tapered as to widen upward and is fixed in close contact with the inner circumferential surface of the hollow portion 106. The reflecting frame 108 can be fixed by, for example, providing a concave/convex engagement portion between the reflecting frame 108 and the case 102. The reflecting frame 108 may be fixed by using an adhesive, or fixed temporarily by some method and then fully by resin molding to be described later. The inner flange 107 serves for positioning the bottom end of the reflecting frame 108 and also preventing short-circuit between the leads caused by the reflecting frame 108.

The reflecting frame 108 may be formed out of a material that is the same as or different from the material used for the leads. In either case, it is preferable that the inner surface of the reflecting frame 108 be subjected to surface treatment so as to improve light reflectivity. In addition, it is preferable that the reflecting frame 108 be structured to have a thickness equal to half or more of the thickness of the lead so as to ensure heat dissipation capability.

Three light emitting chips are fixed on the package 100 with the above-mentioned structure by surface bonding. The light emitting chips 110 are fixed on the first leads 104a, 104b, and 104c, respectively, and also wire-bonded to the second leads 105a, 105b, and 105c, respectively, with wires 111. The light emitting chips emit three primary colors (RGB), respectively. Thus, the three light emitting chips provided in a set can achieve full color display.

FIGS. 14 to 16 show states after the surface bonding or wire bonding is completed. Subsequently, mold resin 112 having light permeability is fed into the hollow portion 106 (see FIG. 9) and then hardened. Then the leads are separated, completing the light emitting element.

A concave portion 109 for receiving the leads is formed on the outer bottom surface of the case 102. The portions of the first leads 104a, 104b, and 104c, and the portions of the second leads 105a, 105b, and 105c protruding out of the case are bent into the concave portion 109 so that the outer bottom surface of the case 102 and the lead bent portions are substantially flush with each other. This decreases the footprint of the light emitting element and also permits surface mounting.

This light emitting element can reflect on the reflecting frame 108 the light emitted by the light emitting chip 110 and efficiently casts the light outside. In addition, the light emitting element can effectively mix together a plurality of emitted light of different colors. The heat generated by the light emitting chip 110 is dissipated outside through the leads. This heat is also conducted from the lead to the reflecting frame 108 since the end of the reflecting frame 108 formed out of a metal faces the lead with a short distance left therebetween, i.e., a distance equivalent to the thickness of the inner flange 107. This causes heat dissipation through the reflecting frame 108, thereby providing better overall heat dissipation efficiency.

In manufacturing the package 100, the case 102 is injection-molded to the lead frame 101 that is flat without any bent portions. This results in less resin leakage and permits easier fabrication than when a bent lead is insert-molded.

In the fifth embodiment, the plan shape of the case is, but not limited to, rectangular. The plan shape of the case may be polygonal other than rectangular, or a circle or an oval. The number of light emitting chips is three in this embodiment, but it may be any number, e.g. one, two, four, or more. Any other modifications may be made without departing from the sprit of the present invention.

INDUSTRIAL APPLICABILITY

The present invention is widely applicable to light emitting elements of the type in which a pair of lead frames formed out of a conductive material is fixed in a case formed out of an insulating material, with a light emitting chip fixed on one of such lead frames.

The invention claimed is:

1. A light emitting element, comprising:
a box-shaped case formed out of an insulating material and having a hollow portion inside;
lead frame formed out of a conductive material and fixed in the case; and
a light emitting chip fixed on the lead frame,
wherein the lead frame has a rise portion formed along an inner surface of a side wall of the case, the hollow portion is surrounded by four side walls, and the rise portion is formed along at least three of the side walls.

2. The light emitting element according to claim 1, wherein the rise portion is bent along both side edges of the lead frame and an end edge thereof orthogonal to the side edges.

3. The light emitting element according to claim 1, wherein the lead frame comprises a first lead frame on which the light emitting chip is fixed and a second lead frame connected to the light emitting chip by wire bonding, and wherein the rise portion is formed at least on the first lead frame.

4. The light emitting element according to claim 3, wherein the second lead frame has a rise portion formed so as to cover a side wall other than the side walls covered by the rise portion of the first lead frame.

* * * * *